United States Patent [19]

Lenz et al.

[11] Patent Number: 5,534,110

[45] Date of Patent: Jul. 9, 1996

[54] SHADOW CLAMP

[75] Inventors: Eric H. Lenz, Palo Alto; Henry Brumbach, Fremont, both of Calif.

[73] Assignee: Lam Research Corporation, Fremont, Calif.

[21] Appl. No.: 99,314

[22] Filed: Jul. 30, 1993

[51] Int. Cl.$^6$ .................... H05H 1/00; B25B 5/00
[52] U.S. Cl. .............. 156/643.1; 156/345; 427/569; 414/941; 269/254 R; 269/903; 118/503; 118/728
[58] Field of Search .................... 156/345, 643, 156/646; 414/941; 118/503, 500, 728; 204/298.31, 298.15, 192.1; 269/254 R, 315, 316, 303, 329, 287, 288, 903; 427/569

[56] References Cited

U.S. PATENT DOCUMENTS

| | | | |
|---|---|---|---|
| 4,615,755 | 10/1986 | Tracy et al. | 156/345 |
| 4,978,412 | 12/1990 | Aoki et al. | 156/345 |
| 5,013,400 | 5/1991 | Kurasaki et al. | 156/643 |
| 5,203,981 | 4/1993 | Akazawa | 156/345 X |
| 5,262,029 | 11/1993 | Erskine et al. | 156/345 X |
| 5,268,067 | 12/1993 | Dostalik et al. | 156/345 X |

FOREIGN PATENT DOCUMENTS

| | | | |
|---|---|---|---|
| 6849 | 1/1992 | Japan | 414/941 |
| 107822 | 4/1992 | Japan | 156/345 |
| 55342 | 3/1993 | Japan | 414/941 |
| 109879 | 4/1993 | Japan | 414/941 |

*Primary Examiner*—Thi Dang
*Attorney, Agent, or Firm*—Burns, Doane, Swecker & Mathis

[57] ABSTRACT

A wafer clamping member for clamping a wafer in a plasma reaction chamber. The clamping member has a design which minimizes particle contamination of the wafer and allows more wafers to be processed before it is necessary to clean built-up deposits from the clamping member. The clamping member includes a clamping portion which clamps an outer periphery of the wafer against a bottom electrode and a shadow portion which provides a gap between an inner edge of the clamping member and the upper surface of the wafer. The gap is open to the interior of the plasma reaction chamber and preferably has a height equal to about a mean free path of a gas activated to form a plasma in the plasma reaction chamber.

11 Claims, 1 Drawing Sheet

SHADOW CLAMP

BACKGROUND OF THE INVENTION

1. Field of the Invention

The invention relates to a wafer clamping device which can be used in a plasma reaction chamber as well as a method of clamping wafers.

2. Description of Related Art

Ring clamps for clamping wafers against electrodes in plasma etching chambers are disclosed in U.S. Pat. Nos. 4,615,755 and 5,013,400, the disclosures of which are hereby incorporated by reference.

FIG. 1 shows a cross section of a conventional wafer clamping device in a plasma reaction chamber wherein a wafer clamp 1 presses an outer periphery of a wafer 2 against an electrode 3. An annular barrier 3a surrounds electrode 3 and clamp 1 includes conical surface 1a which mates with a conical surface on barrier 3a. Clamp 1 also includes annular surface 1b extending radially outward from conical surface 1a. During processing (e.g. etching, coating, etc.) of wafers in the chamber, by-products of the process result in a build-up of a deposit 4 (such as a polymer build-up during etching of the wafer) on an edge of the clamp 1 in contact with the wafer 2. The deposits 4 must be removed periodically in order to prevent particle contamination of the wafers. That is, due to rubbing contact between a clamping surface 5 of the clamp 1 and an upper surface 6 of the wafer 2 during wafer transfer, particles of the deposit 4 break off and fall onto the surface 6 of the wafer being processed. Accordingly, it is necessary to frequently shut down the plasma reaction chamber and clean the wafer clamping apparatus in order to avoid the particle contamination problem.

There is a need in the art for a wafer clamping apparatus which does not suffer from the disadvantages described above of the conventional wafer clamping device. That is, a damping member which allows the plasma reaction chamber to run a significantly longer time before cleaning of the clamp becomes necessary would provide higher quality wafers due to reduced particle contamination and would provide economic benefits in allowing more efficient use of the equipment due to reduced down time for chamber/clamping member cleaning.

SUMMARY OF THE INVENTION

The invention provides an improved clamping design for clamping a wafer in a plasma reaction chamber. In particular, the clamping member includes a clamping portion and a shadow portion. The clamping portion is capable of clamping against an outer periphery of a wafer in the plasma reaction chamber and the shadow portion extends over the wafer such that an open gap is formed between the wafer and the shadow portion. The gap is in fluid communication with the interior of the plasma reaction chamber and functions to inhibit built-up deposits on the clamping member from contacting the wafer during clamping and processing of wafers. Thus, the clamping member can operate a significantly longer time without particle contamination of the wafers compared to a clamping member which does not include such a gap.

According to various features of the invention, the gap can be dimensioned such that an inner edge of the clamp is spaced above the wafer by a distance equal to about a mean free path of a gas activated to form a plasma in the plasma reaction chamber. The gap can have a length in a direction parallel to a major surface of the wafer greater than a height of the gap between the wafer and the inner edge of the clamp. The length can be at least two times or even up to five times or greater than the height. According to a preferred embodiment, the gap has a height of 0.005 to 0.030 inch, this height extending between the wafer and a surface of the shadow portion facing the wafer. When the height is equal to about a mean free path of a reactant gas used in the plasma reaction chamber, the gap functions to retard growth of built-up deposits on the clamping member in a direction towards the wafer. That is, the deposits tend to build-up in directions which extend parallel to the wafer surface and away from the wafer surface thereby maintaining a gap between the built-up deposit and the wafer surface. Thus, particle contamination of the wafer can be avoided.

According to one aspect of the invention, the clamping member can comprise a single piece of material. According to another embodiment of the invention, the clamping member can comprise first and second discrete pieces wherein the clamping portion is part of the first piece and the shadow portion is part of the second piece. The second piece can include a support surface attached to the first piece and a shadow surface which is exposed and extends away from the first piece so as to face the wafer with the gap therebetween.

The plasma reaction chamber can include, at least one gas inlet means for introducing processing gas into the reaction chamber and plasma generating means for activating the process gas to form a plasma in the reaction chamber. Thus, according to the invention a wafer can be treated in the plasma reaction chamber by clamping the clamping member against an outer periphery of the wafer and the wafer can be treated by introducing a plasma processing gas into the plasma reaction chamber and activating the processing gas with the plasma generating means to form a plasma whereby the wafer can be processed (e.g., etched, coated, etc.). The method can also include a step of cleaning deposits such as polymer build-up on the clamping member when such deposits substantially close the gap between the wafer and the shadow portion of the clamping member.

DETAILED DESCRIPTION OF THE PREFERRED EMBODIMENTS

In the following description, a wafer clamping member is described with reference to clamping a wafer in a plasma etching apparatus. However, the clamping member can be used in other plasma reaction chambers wherein deposition or other treatments are carded out.

In plasma etching it is often necessary to mechanically clamp wafers to the lower electrode for cooling the wafer with a thermally conductive gas at higher pressures than the etching chamber. Plasma etching can also create large amounts of polymeric compounds that deposit on the surface of the mechanical clamp and the surfaces of the chamber. These polymeric compounds are not as much of a problem on the chamber walls as they are on the clamp. The clamp, because of its movement with every wafer transfer, is a problem in that it can shed some of this polymer as a result of rubbing of surfaces.

Clamping systems have had problems with particles being shed on to the wafer at fairly short intervals after being cleaned. The shadow clamp according to the invention greatly increases the times between occurrence of particle problems. In particular, the shadow clamp controls the problem of the polymer that is deposited on the inner edge of the clamp. This polymer is a problem because it will touch the wafer and has a chance of being knocked off every time a wafer is clamped. The shadow clamp allows polymer to grow on the inner edge of the clamp, but the polymer does not touch the wafer. The shadow clamp accomplishes this by raising the inner edge of the clamp above the wafer. For instance, the inner edge can be located above the wafer by a distance on the order of the mean free path of the etch chamber gas. Further, the first contact point between the wafer and the clamp can be located away from the inner edge by a distance equal to two to five times the height that the inner edge is raised.

Figure 1:
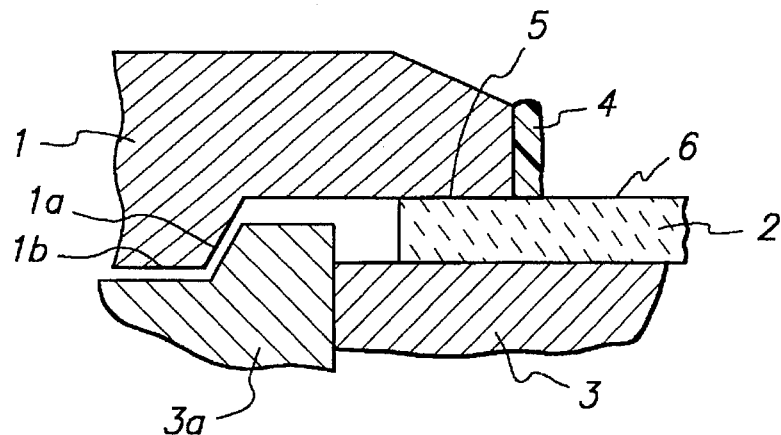
FIG. 1 shows a conventional clamping member clamping an outer periphery of a wafer against a bottom electrode in a plasma reaction chamber.

The polymer that builds on the front edge of the shadow clamp builds in both the vertical and horizontal directions. The polymer that builds in the vertical direction eventually touches the wafer mad creates particles, but this takes on the order of 6 times the time it takes for particles to cause particle contamination on a conventional clamp such as the clamp shown in FIG. 1. As an example, the clamp shown in FIG. 1 must be cleaned after 500 minutes of plasma etching whereas it is not necessary to clean the shadow clamp for 3000 minutes since the narrow initial gap between the inner edge of the shadow clamp and the wafer prevents polymer from growing on the edge of the clamp that touches the wafer.

Figure 2:
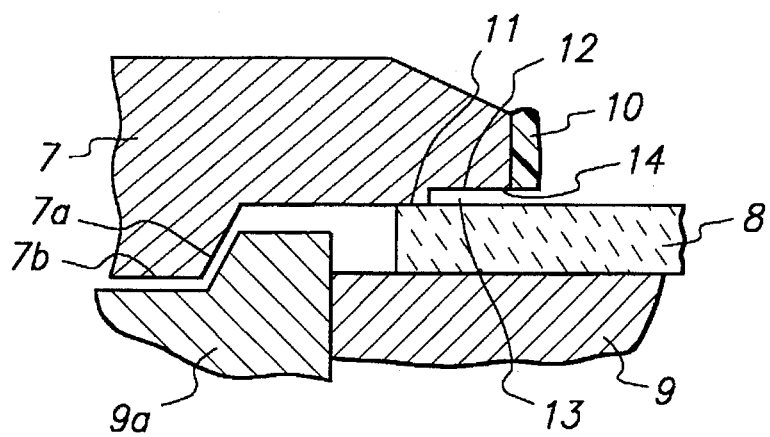
FIG. 2 shows a one-piece clamping member in accordance with the invention wherein a gap is provided between the inner edge of the clamping member and an upper surface of the wafer.

FIG. 2 shows an embodiment of a one-piece clamping member 7 in accordance with the invention. In particular, the clamping member 7 is engageable with an outer periphery of a wafer 8 whereby the wafer 8 can be clamped against an electrode 9. Member 7 includes conical surface 7a which mates with a conical surface on annular barrier 9a and annular surface 7b extends radially outward from surface 7a. During processing of wafers, by-products of the plasma treatment result in a build-up of a deposit 10 on the clamping member 7. In order to avoid the particle contamination problem of conventional clamping members, clamping member 7 includes a clamping portion 11 and a shadow portion 12. As shown in FIG. 2, the clamping portion 11 presses against an outer periphery of the wafer 8 and the shadow portion extends over the wafer 8 such that an open gap 13 is formed between the wafer 8 and the shadow portion 12. According to a preferred embodiment, the gap 13 is dimensioned such that an inner edge 14 of the clamp 7 is spaced above the wafer 8 by a distance equal to about a mean free path of a gas activated to form a plasma in the plasma reaction chamber.

Figure 3:
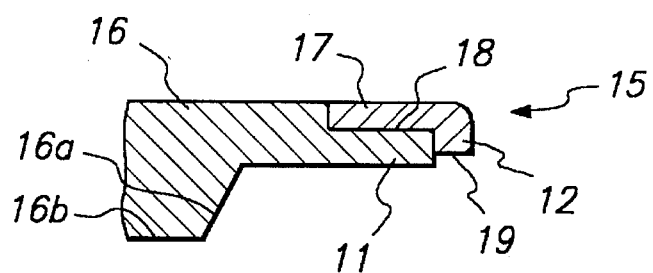
FIG. 3 shows another embodiment of a clamping member in accordance with the invention wherein the clamping member is provided in two separate pieces.

FIG. 3 shows an embodiment of a two-piece clamping member 15 in accordance with the invention. In particular, the clamping member 15 is provided in two separate pieces 16, 17 with the clamping portion 11 forming part of the first piece 16 and the shadow portion 12 forming part of the second piece 17. The second piece 17 includes a support surface 18 and a shadow surface 19. The support surface 18 is attached by any suitable means to the first piece 16 and the shadow surface 19 is an exposed surface which extends away from the first piece 16 and faces a wafer clamped by the clamping member 15. First piece 16 includes conical surface 16a and annular surface 16b extending radially outward therefrom, surfaces 16a and 16b functioning in the same manner as surfaces 7a, 7b in FIG. 2. Accordingly, the clamping member according to the embodiments shown in FIGS. 2 and 3 include first, second and third concentrically arranged and vertically offset planar surfaces extending continuously around a lower side thereof, the first surface being located on the shadow portion, the second surface being located on the clamping portion, and the third surface being located radially outward from the second surface.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of treating a wafer in a plasma reaction chamber, the plasma reaction chamber including at least one bas inlet means for introducing processing gas into the reaction chamber and plasma generating means for activating the processing gas to form a plasma in the reaction chamber, comprising steps of:

clamping a clamping member against an outer periphery of a wafer in the plasma reaction chamber, the clamping member including a clamping portion and a shadow portion, the clamping portion being clamped against the outer periphery of the wafer and the shadow portion extending over the wafer with a gap between the wafer and the shadow portion, the gap being in fluid communication with an interior of the plasma reaction chamber and the gap being dimensioned to prevent built-up deposits on an inner edge of the clamping member from contacting the wafer during the clamping step; and treating the wafer by introducing a plasma processing gas into the plasma reaction chamber and activating the processing gas with the plasma generating means to form plasma.

2. The method of claim 1, further comprising a cleaning step wherein built-up deposits are removed from the clamping member when the deposits substantially close the gap between the wafer and the shadow portion of the clamping member.

3. A clamp for clamping a wafer in a plasma reaction chamber, comprising:

a clamping member including a clamping portion and a shadow portion, the shadow portion extending radially inward from the clamping portion, the clamping portion including means for clamping against an upper surface on an outer periphery of a wafer in a plasma reaction chamber and the shadow portion including means for forming an open gap between the wafer and the shadow portion such that the gap is open and in fluid communication with an interior of the plasma reaction chamber, the clamping member including first, second and third concentrically arranged and vertically offset surfaces extending continuously around a lower side thereof, the first surface being located on the shadow portion, the second surface being located on the clamping portion, and the third surface being located radially outward from the second surface.

4. The clamp of claim 3, wherein the first, second and third surfaces are planar surfaces and the gap is dimensioned such that an inner edge of the clamp is spaced from the wafer by a distance equal to about a mean free path of a gas activated to form a plasma in the plasma reaction chamber.

5. The clamp of claim 3, wherein the gap has a length in a direction parallel to the major surface of the wafer greater than a height of the gap between the wafer and an inner edge of the clamp.

6. The clamp of claim 5, wherein the length is at least two times greater than the height.

7. The clamp of claim 5, wherein the length is at least five times greater than the height.

8. The clamp of claim 5, wherein the height is equal to about a mean free path of a reactant gas used in the plasma reaction chamber.

9. The clamp of claim 3, wherein the clamping member comprises first and second separate pieces, the clamping portion being part of the first piece and the shadow portion being part of the second piece.

10. The clamp of claim 9, wherein the second piece includes a support surface and a shadow surface, the support surface being attached to the first piece and the shadow surface being an exposed surface extending away from the first piece and facing the wafer.

11. The clamp of claim 3, wherein the gap has a height of 0.005 to 0.030 inch between the wafer and a surface of the shadow portion facing the wafer.

* * * * *